(12) United States Patent
Pozidis

(10) Patent No.: US 6,859,903 B2
(45) Date of Patent: Feb. 22, 2005

(54) DETECTION UNIT, DEVICE FOR REPRODUCING AN INFORMATION CARRIER AND METHOD FOR DETECTING

(75) Inventor: Charalampos Pozidis, Gattikon (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 393 days.

(21) Appl. No.: 09/994,271

(22) Filed: Nov. 26, 2001

(65) Prior Publication Data

US 2003/0005383 A1 Jan. 2, 2003

(30) Foreign Application Priority Data

Nov. 28, 2000 (EP) .............................. 00204218

(51) Int. Cl.⁷ ..................... H03M 13/00; G11C 29/00; G11B 5/09
(52) U.S. Cl. ................. 714/752; 369/47.18; 369/275.3; 360/32; 360/48; 360/51
(58) Field of Search ..................... 714/752; 369/47.18, 369/275.3, 275.4; 360/32, 46, 48, 51; 375/232, 274, 277, 278, 349

(56) References Cited

U.S. PATENT DOCUMENTS 4,669,091 A * 5/1987 Nossen ...................... 375/232
5,065,389 A * 11/1991 Roth ......................... 369/47.18
5,835,296 A * 11/1998 Van Den Enden ............ 360/51
6,031,815 A * 2/2000 Heemskerk ............... 369/275.3

FOREIGN PATENT DOCUMENTS

WO   WO9827681 A3   6/1998   ............. H04L/1/20
WO   WO9827681 A2   6/1998   ............. H04L/1/20

OTHER PUBLICATIONS

PHNL 000283 U.S. Appl. No. 09/860,308, filed May 18, 2001, Inventors, Charalampos Pozidis, Willem M. Coene, Johannes W. Bergmans, Entitled: Detector, Reproduction System, Receiver and Method.

* cited by examiner

Primary Examiner—Emmanuel L. Moise
(74) Attorney, Agent, or Firm—Michael E. Belk

(57) ABSTRACT

Bits in a first binary signal are compared with one or more first binary patterns. For each first binary patterns, if the comparison meets a predetermined criteria for the first binary pattern, than an evaluation value is calculated for that first binary pattern and for one or more secondary binary patterns that correspond to that first binary pattern, the evaluation value indicating the likelihood that each respective binary pattern corresponds with a portion of a run length limited binary signal represented by the bits of the first binary signal. The first binary signal is corrected to correspond with the binary pattern that was determined most likely to be a portion of the run length limited binary signal.

9 Claims, 4 Drawing Sheets

DETECTION UNIT, DEVICE FOR REPRODUCING AN INFORMATION CARRIER AND METHOD FOR DETECTING

The invention relates to a detection unit.

The invention also relates to a device for reproducing an information carrier.

The invention further relates to a method for detecting.

In a device for reproducing an information carrier information is reproduced from physical detectable patterns stored in tracks at the information carrier. The physically detectable patterns are for example magnetically detectable patterns or optically detectable patterns. The latter patterns for example comprise a plurality of pits, or consist of a sequence of locations having a different phase. In order to retrieve the information from the information carrier with a limited amount of inter symbol interference and to enable clock recovery from the reproduced signal the information is usually stored in the form of a runlength-limited modulation code at the information carrier. It is a general tendency both to increase the density with which the information is stored at the information carrier and to increase the speed with which the information is reproduced from the information carrier. An essential step in the process of reproducing the information is recovering a binary sequence from an analogue signal representing a runlength limited sequence. Several methods are known for this step, such as threshold detection in which the analog signal is compared with a threshold and a binary value is assigned having a value which depends on the sign of the difference between the value of the analog signal and the threshold. In order to improve the accuracy of the binary signal obtained by threshold detection the so obtained preliminary binary signal may be corrected by a runlength pushback detector, which corrects the runlength violations in the preliminary binary signal. Again another method is the Viterbi method which computes the binary signal on the basis of a maximum likelihood criterion. The accuracy of the first two methods however is limited, while the third method is computationally intensive.

It is a purpose of the invention to provide a relatively simple yet relatively accurate detection unit for recovering a binary sequence from an analogue signal representing a runlength limited sequence.

It is a further purpose to provide a device for reproducing a record carrier comprising such a detection unit.

It is a still further purpose to provide a relatively simple yet relatively accurate detection method.

According to the invention a detection unit for recovering a binary sequence from an analogue signal representing a runlength limited sequence is provided which includes a preliminary detection module for generating a preliminary binary signal from the analogue signal and a correction module for generating a corrected binary signal from the preliminary binary signal, the correction module comprising a delay line having a chain of delay elements, coupled to the preliminary detection module, storage means for storing one or more first binary patterns and one or more second binary patterns for each of the first binary patterns, a comparator coupled to the delay line and the storage means, for outputting a detection signal indicating whether a sequence of bits present in the preliminary binary signal is identical to a first binary pattern, an evaluator coupled to the storage means and to the input for computing an evaluation value indicating the likelihood that a binary pattern corresponds to the runlength limited sequence represented by the analogue signal, a selector for selecting a binary pattern from the first binary pattern and the one or more second binary patterns for said first binary pattern having the highest likelihood, a corrector for correcting the sequence of bits in the delay line such that it corresponds to the selected binary pattern, if said selected binary pattern is not the first binary pattern, an output coupled to the delayline.

On the one hand the detector of the invention is efficient, in that the correction process is restricted to bitsequences which are error prone. On the other hand the detector is accurate in that the correct sequence of bits is selected from the detected first binary pattern and the one or more second binary patterns for said first binary pattern on the basis of a maximum likelihood criterion.

A classification of the error events that determine the performance of the threshold detector in minimum runlength systems, such as the d=2 system, served as the motivation for the present invention. This classification revealed, that the vast majority of errors are either single-bit or double-bit errors. These two categories will be examined separately in the sequel.

Single-bit errors are defined as these errors that affect a single bit of the current run only; this implies that both the preceding and following runs are error-free. Single-bit errors may be divided in three categories:

(1a) those that occur in the first or last bit of a run having the minimum allowed runlength, (1b) those that occur in the first or last bit of a run which is longer than the minimum allowed runlength, and (1c) those that occur in any other bit (that is, not in one of the edge-bits) of any run.

It can be shown that errors of the form (1c) occur with a very low probability and thus can be safely ignored, since they do not limit the resulting performance. Errors of the form (1a) create runs having a length shorter than the minimum allowed runlength. These runs violate the minimum runlength constraint of the RLL code, and can be easily located and corrected, by detectors as described in EP 0 885 499 or by T. Nakagawa, H. Ino and Y. Shimpuku in "A Simple Detection Method for RLL Codes (Run detector)", IEEE Trans. Magn., vol. 33, no. 5, pp3262–3264, September 1997. Detectors of this form will be referred to as Runlength Pushback Detectors (RPD).

Errors of the form (1b) are not easy to detect, since they do not create minimum runlength violations. However, they account for a significant portion of the total number of errors in the sliced bit-stream. Double-bit errors are classified here in two categories:

(2a) those that occur in the same run, and (2b) those that comprise two single-bit errors occurring in consecutive runs.

Due to the lowpass nature of the optical recording channel, short runs in the channel bit-stream are most prone to distortion due to intersymbol interference (ISI). As a result, errors of the form (2a) occur mostly in runs having the minimum allowed runlength, in the first and the last bit of the run. A double-bit error of this form creates single-bit (I1) runs in the sliced bit-stream, which violate the minimum runlength requirements. As in (1a), these errors can be located and corrected through the use of a runlength pushback detector.

Errors of the form (2b) most probably are shifted runs. A shifted run is a run in the sliced bit-stream, which is shifted by one bit-position (to the left or to the right) with respect to its corresponding position in the channel bit-stream. Shifted runs cause two bit-errors in consecutive runs, the errors being separated by a number of correct bits, which number depends on the minimum allowed runlength. As an example errors of the form 2a and 2b are shown in the following table for the case of a d=2 code.

|        | case 2a       | case 2b       |
|--------|---------------|---------------|
| $a_k$  | - - + + + - - | - - + + + - - |
| $a'_k$ | - - - + - - - | - + + + - - - |
| $d_k$  | 0 0 + 0 + 0 0 | 0 - 0 0 + 0 0 |

Herein $a_k$ is the original sequence of bits, $a'_k$ is the erroneously detected sequence of bits and $d_k$ is a difference function: $d_k = \text{sign}(a_k - a'_k)$.

Detection of shifted runs having the minimum allowed runlength is not straightforward. However, the search space is limited, since only the runs with the minimum allowed runlength have to be checked for possible errors. The shift detector, as described in the earlier filed application PHNL000283 follows such an approach. The shift detector first locates isolated runs with minimum allowed runlength, or series of concatenated runs of the minimum allowed runlength m in the sliced bit-stream. It then forms several bit-patterns consisting of all possible single-bit shifts of I3's within the pattern. Finally, the pattern corresponding to the highest likelihood is chosen. The detector described in this earlier filed application differs from the detector according to the present invention in that it only detects the occurrence of patterns complying with a general description, i.e. the pattern subsequently comprising at least a first neighboring bit of a run of length greater or equal than m+1, one or more further runs of length m, and at least a second neighboring bit of a run of length greater or equal than m+1. The detector according to the present invention compares a sequence of bits within the preliminary input stream with a predetermined set of first binary patterns.

Claim 2 describes a detector according to the invention which is particularly suitable for detecting errors of the form (1b). As discussed above these errors are not easy to detect with known means, since they do not create minimum runlength violations. However, they account for a significant portion of the total number of errors in the sliced bit-stream.

The detector of claim 2 is preferably used within a configuration as described in the implementation of claim 3. In said implementation the preliminary detection module comprises a chain of modules including a slicer, a runlength pushback detector and a shift detector. The slicer provides a fast preliminary detection. Runlength violations in the result so obtained are corrected by a runlength pushback detector. Shifted runs having a minimum runlength appear to occur relatively often, but are not detected by a runlength pushback detector. These are detected by the shift detector. Such a shift detector is described in the earlier filed application PHNL000283, which application is incorporated by reference herein. The errors remaining in the output signal provided by the shift detector are mainly caused by errors in edge of runs having a runlength greater than the minimum allowed runlength. These errors are however effectively corrected by the detector according to the invention.

A device according to the invention for reproducing an information carrier comprises a read head for reproducing a read signal from a physically detectable pattern in tracks at the information carrier, movement means for causing a relative movement between the information carrier and the read head, a detector according to one or more of the claims 1 to 6 for reproducing a binary signal from the read signal, a first circuitry module for controlling the movement means, a second circuitry module for generating an output information signal from the binary signal by channel decoding and/or error correction decoding.

A method according to the invention for recovering a binary sequence from an analogue signal representing a runlength limited sequence, comprises the steps of generating a preliminary binary signal from the analogue signal, comparing a sequence of bits present in the preliminary with a first binary pattern, if the comparison has a positive result for a first binary pattern computing an evaluation value for said first binary pattern and for one or more second binary patterns, the evaluation value indicating the likelihood that a binary pattern corresponds to the runlength limited sequence represented by the analogue signal, selecting a binary pattern from the first binary pattern and the one or more second binary patterns for said first binary pattern which has the highest likelihood, correcting the sequence of bits in the preliminary binary signal such that it corresponds to the selected binary pattern, if said selected binary pattern is not the first binary pattern.

These and other aspects of the invention are described in more detail with reference to the drawing. Therein FIG. 1 shows a device for reproducing an information carrier.

FIG. 1A shows a part of an information carrier.

FIG. 2 schematically shows a detection unit according to the invention.

Figure 1:
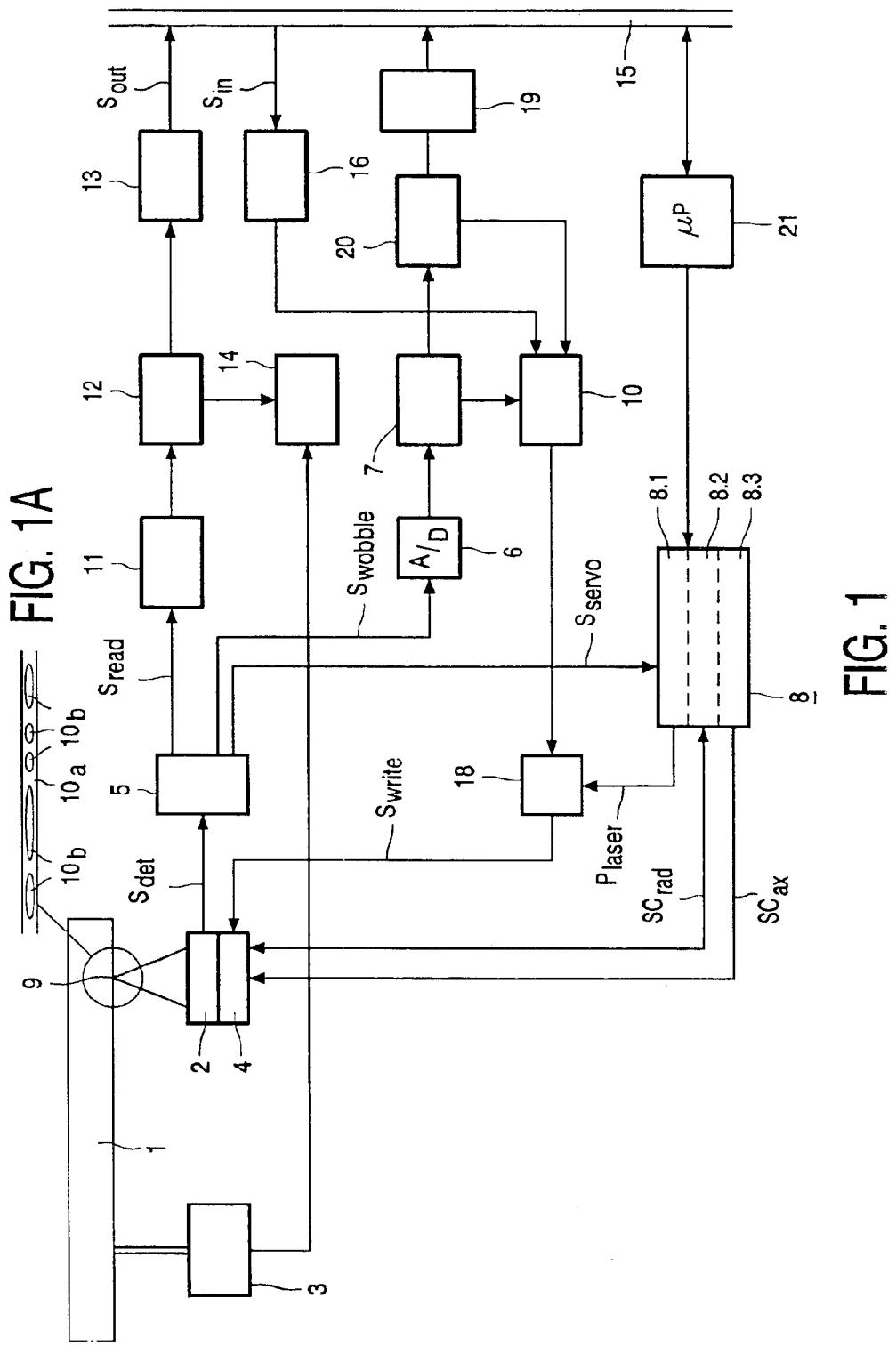

FIG. 1 shows a device for reproducing an information carrier 1 which comprises a read head for reproducing a read signal (Sread) from a physically detectable pattern in tracks at the information carrier. The head is also suitable for writing information to the information carrier. In the embodiment shown the information carrier is disc shaped and the information is stored in the form of optically detectable patterns at the record carrier. The optical pattern is for example stored in a phase change medium such as GeSbTe or AgInSbTe. Information is written by scanning the information carrier with a modulated optical beam, which may be generated by a radiation source, such as a laser. The device according to the invention further comprises movement means for causing a relative movement between the information carrier 1 and the read/write head 2. The movement means comprise a spindle motor 3 for rotating the information carrier and radial movement means 4 for radially moving the read head. The radial movement means may e.g. comprise a slide or a swing arm for radially moving the read head. In addition the read/write head 2 may comprise fine positioning means, such as an actuator for moving a lens or a mirror in an optical system forming part of the read/write head.

Figure 2:
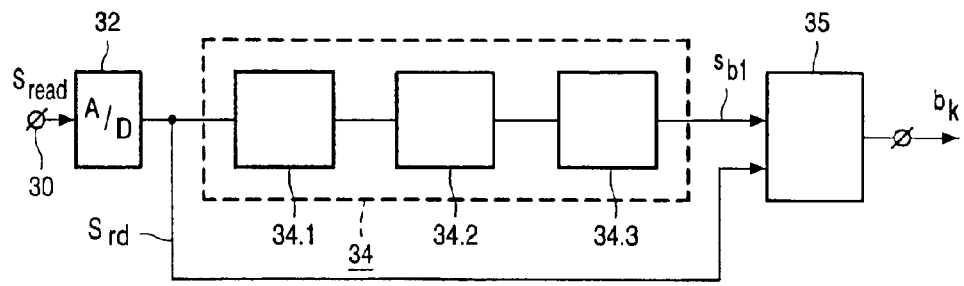

The read/write head 2 comprises optical detectors, which generate detection signals Sdet. The read signal Sread is derived from the detection signals by means of a signal processor 5. The signal processor 5 further generates from these signals a wobble signal Swobble and servo signals Sservo. The wobble signal Swobble is provided via a A/D-converter 6 to a wobble processor 7. The servo signals Sservo are provided to a servo unit 8, which comprises a first servo module 8.1 for controlling the power of the radiation source, a second servo module 8.2 for controlling the radial position which is scanned by the read/write head, and a third servo module 8.3 for axial control, i.e. to maintain the scanning spot 9 with which the read/write head 2 scans the information carrier 1 in focus. As shown in FIG. 1A the head 2 scans a track 10a of the information carrier 1 with spots 10b which represent a binary sequence $a_k$. In order to control the radial position which is scanned by the read/write head 4, the second servo module 8.2 provides servo control signals SCrad to the radial movement means. The second servo module 8.2 may estimate the radial position on the basis of the servo signals Sservo, which are derived from the detection signals Sdet. However the radial position may otherwise, or in addition be estimated from measurement signals which are obtained by measuring a position of a motor, which controls the radial position of the read/write head 2. Such measurement signals are e.g. obtained with Hall-elements. The third servo module controls the axial position by means of axial control signals SCax. A device according to the invention may have a read mode, a write mode or both. In a read mode the signal processor 5 provides a read signal Sread via an A/D-converter 11 to a bitdetector and demodulator 12. The demodulated signal is provided to an error correcting unit 13 which on its turn provides the error corrected signal Sout to an output bus 15 i.e. a serial bus or a IEC958 bus. The bitdetector and demodulator 12 also provides a control signal to a motor controller 14 so as to control the speed with which the information is read from the information carrier 1. In a write mode of the device, an input signal Sin is received from the bus 15. The input signal Sin is subsequently encoded with an error correction code e.g. by a CIRC-encoder 16 and channel encoded by channel encoder 10 and provided to a write strategy generator 18 to generate a write signal Swrite. The write strategy generator 18 is controlled by the servo control signal Plaser generated by the first servo module 8.1. The device shown also comprises CDtext decoder/encoder 19 and encode controller 20 by means of which CDtext may be included in the subcode of the signal which is written at the information carrier 1. The wobble processor 7 provides a clock signal to a channel encoder 10, so that the information is written at the information carrier 1 at a speed which corresponds to the linear velocity of the information carrier 1. The device shown in FIG. 1 further comprises a microprocessor 21 which allows high level control of the servo unit 8. The microprocessor 21 may e.g. control startup procedures FIG. 2 schematically shows the detection unit 11 of the device of FIG. 1. The detection unit 11 includes a preliminary detection module 34, which generates a preliminary binary signal Sb1 from the analogue signal after it has been digitized into Sread. Otherwise the preliminary detection module 34 may directly generate the preliminary binary signal Sb1 from the analogue input signal Sread. The preliminary detection module 34 comprises a slicer 34.1 coupled to the input 30 via the A/D-converter 32. A runlength pushback detector 34.2 is coupled to the output of the slicer 34.1. The latter corrects errors which violate the runlength constraints. A runlength pushback detector is described for example in WO 98/27681. A shift detector 34.3 is coupled to the output of the runlength pushback detector 34.2 which detects timeshifted runs having a length corresponding to the minimum runlength. Such a shift detector is described in PHNL000283. The detection unit 11 further includes a correction module 35 for correcting the preliminary binary signal Sb1.

Figure 3:
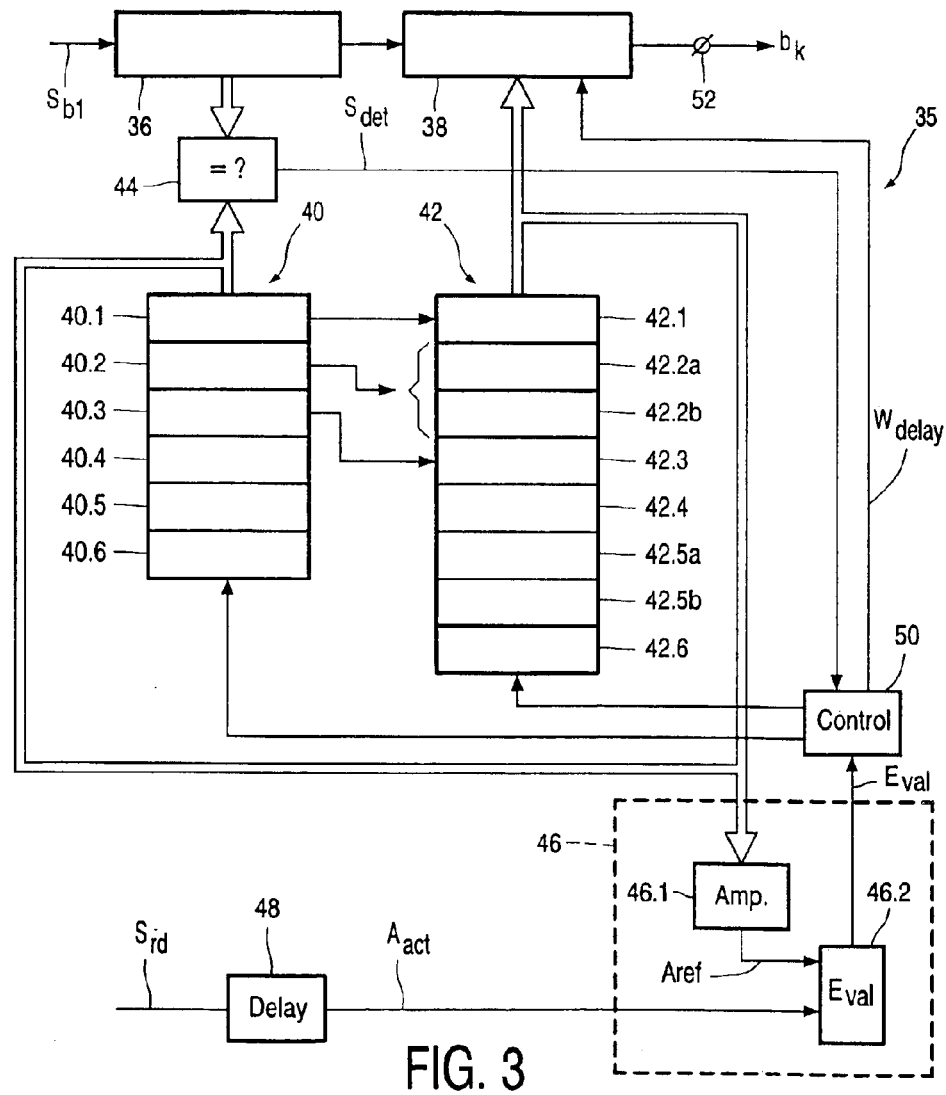
FIG. 3 shows a module of the detection unit in more detail.

FIG. 3 shows an embodiment of the correction module 35 in more detail. The detection unit comprises an input 30 for receiving the analogue signal Sread. The input 30 is coupled to an A/D-converter 32 which converts the analogue input signal Sread into a digitized input signal Sread'. The detection unit 11 further comprises a correction module comprises a delay line 36, 38 having a chain of delay elements (not shown). The delay line 36, 38 is coupled to the preliminary detection module 34. The detection unit 11 further comprises storage means 40 for storing one or more first binary patterns. In the embodiment shown the binary patterns are stored in the storage locations 40.1 to 40.6 respectively. The detection unit 11 also has storage means 42 for one or more second binary patterns for each of the first binary patterns. For example the storage means 42 comprise a storage location 42.1 for storing a second binary pattern relating to the first binary pattern in storage location 40.1. The storage locations 42.2a and 42.2b comprise each a second binary pattern which relates to the first binary pattern stored in 40.2. The storage means may for example be in the form of a dynamic or static memory or implemented as registers within a controller. A comparator 44 is coupled to the delay line 36 and the storage means 40, for outputting a detection signal Sdet indicating whether a sequence of bits present in the preliminary binary signal Sb1 is identical to a first binary pattern. An evaluator 46 is coupled to the storage means 40 and to the input 30 via the A/D-converter 32 and a further delay unit 48. The evaluator 46 computes an evaluation value Eval indicating the likelihood that a binary pattern corresponds to the runlength limited sequence represented by the analogue signal Sread. In the embodiment shown the evaluator comprises a referencelevel generator

46.1, which predicts an amplitude Aref from the binary pattern. An evaluation value Eval is calculated from this reference value and the actual value Aact obtained from the input signal Sread via the further delay unit 48. Preferably the actual value Aact is delayed so many cycles that it corresponds to the center of the binary sequence which is obtained by the preliminary detector 34. A controller 50 functions as a selector which selects a binary pattern from the first binary pattern and the one or more second binary patterns for said first binary pattern having the highest likelihood. The detection unit 11 comprises a corrector for correcting the sequence of bits in the delay line such that it corresponds to the selected binary pattern, if said selected binary pattern is not the first binary pattern. In this embodiment the controller 50 also functions as a corrector in that it provides a write enable signal Wdelay to the second part 38 of the delay line so that the contents thereof are overwritten by the contents of the selected storage location in the storage means 42. An output 52 is coupled to the delayline for providing the recovered binary sequence bk.

The following table shows a combination of first and secondary binary patterns which may be used for correcting a runlength limited signal with a minimum runlength constraint of d=2.

| 40   | 1st binary pattern | 42    | 2nd binary pattern |
|------|--------------------|-------|--------------------|
| 40.1 | − − − − + + + −    | 42.1  | − − − ⊞ + + + −    |
| 40.2 | − − − − + + + +    | 42.2a | − − − − ⊟ + + +    |
|      |                    | 42.2b | − − − ⊞ + + + +    |
| 40.3 | + − − − + + + +    | 42.3  | + − − − ⊟ + + +    |
| 40.4 | − + + + − − − −    | 42.4  | − + + + ⊞ − − −    |
| 40.5 | + + + + − − − −    | 42.5a | + + + ⊟ − − −      |
|      |                    | 42.5b | + + + + ⊞ − −      |
| 40.6 | + + + + − − − +    | 42.6  | + + + ⊟ − − +      |

The first column therein shows the storage location within the storage means 40, which are reserved for the first binary pattern. The second column shows the first binary pattern stored therein. The third column shows the storage location within the storage means 42 for storing the second binary patterns, which are shown in the fourth column of the table. In the embodiment shown the first binary pattern and the one or more second binary patterns differ at exactly one bit. Said bit is positioned at the edge of a run in the second binary pattern having a length greater than the minimum allowed runlength. As a example, the first binary pattern in storage location 40.1 may be either correct, or may have resulted from the second binary pattern in storage location 42.1 by an erroneous detection of the encadred bit thereof. This detection error is not detected by a runlength pushback detector because it does not violate the runlength constraint.

Likewise the first binary pattern stored in 40.2 may be correct, but it may alternatively have resulted from one of the two second binary patterns stored in storage locations 42.2a and 42.2b.

The evaluation value Eval is preferably based on a distance value. Such a distance value is for example the L1-norm or the L2-norm. According to the L1-norm the distance D is defined as:

$$D=ABS\ (\text{Aref}-\text{Aact}).$$

The definition of the distance according to the L2-norm is:

$$D=(\text{Aref}-\text{Aact})^2.$$

The likelihood that a binary pattern corresponds to the original runlength limited sequence ($a_k$) which is represented by the analogue signal is a monotonously decreasing function of the distance.

The reference value Aref may be calculated in several ways. E.g. the reference level Aref may be computed from said binary sequence with a finite length channel model which represents the optical impulse response. Otherwise the reference level Aref corresponding to a particular binary sequence may be computed by measuring an amplitude value of the analog input signal during a plurality of occurrences of a particular binary sequence and averaging said amplitude values. Such a method is described in EP1046165.

Figure 4:
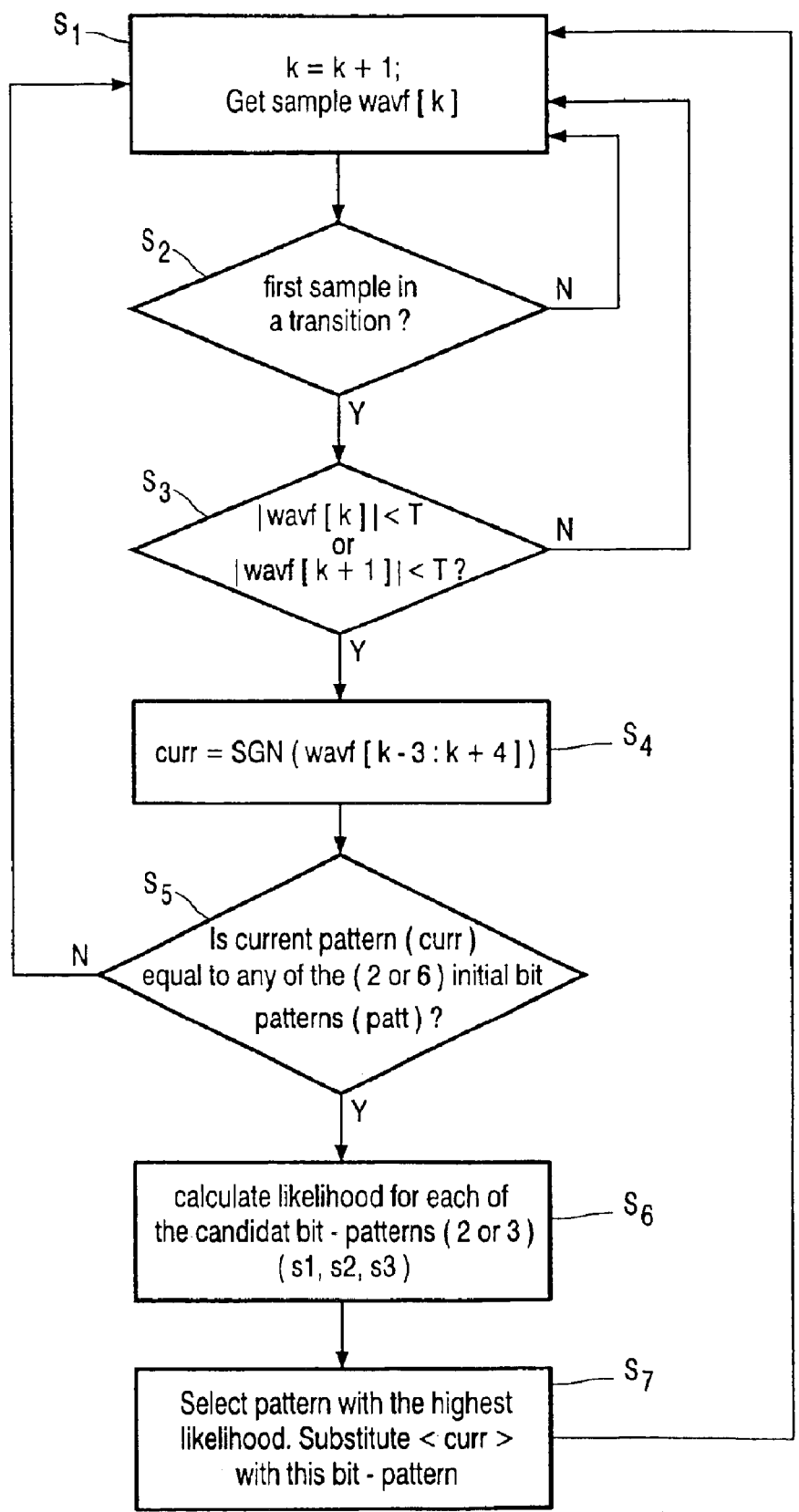
FIG. 4 shows the method according to the invention in more detail.

FIG. 4 shows a flowchart which illustrates the method according to the invention. In program portion S1 an index k is increased and a sample Sread[k] of the input signal Sread is obtained. In program portion S2 it is checked whether the sample Sread[k] is the first sample in a transition. If this is not the case the program continues with program portion S1. In this way the efficiency of the method is significantly improved, while the accuracy is hardly influenced, because most detection errors occur at a transition. If it is found that the sample is the first one in a transition the program continues with program portion S3. In this program portion it is verified whether the amplitude of the sample Sread[k] or the amplitude of the succeeding sample Sread[k+1] is below a threshold value. If neither of the samples has an amplitude below the threshold value the program continues with the next sample in program portion S1. However if the amplitude of one or both of the samples is below the threshold value, this is an indication that a simple detection on the basis of the sign of the sample is insufficient. In that case the program continues with program portion S4, wherein a preliminary detection takes place on the basis of the sign of sequence of samples in a window around the sample k, e.g. the samples within the window k−3 until k+4. The sequence of bits so obtained is compared in step S5 with the first binary patterns stored in the storage means, for example the patterns stored in the storage locations 40.1 until 40.6. If the sequence of bits does not match with either of these first binary patterns the program continues with program portion S1. However if a match is found the program continues with the program portion S6. Herein the likelihood is computed that the binary pattern which matches the sequence of bits in program portion S4 corresponds to the runlength limited sequence ak stored in the tracks of the information carrier 1 and which was represented by the analogue signal Sread. This computation is repeated in program portion S6 for the one or more second binary patterns. If the likelihood of correspondence of a second binary pattern is higher than the likelihood of the first binary pattern, a bit assigned to the sample within the preliminary detected sequence of bits is replaced by the bit at the same position within said second binary pattern in step S7. In the above table the bit which is replaced, is either the bit k, at the left of the transition, or the bit k+1 at the right of the transition. The bit k is replaced when one of the binary patterns 42.1, 42.2b, 42.5a or 42.6 is selected. The bit k+1 is replaced when one of the binary patterns 42.2a, 42.3, 42.4 or 42.5b is selected. The program then continues with program portion S1.

For a practical evaluation the detector according to the invention was applied to an analog input stream obtained from a DVD-ROM sample with +9.2% linear density and an asymmetry of 9%. The results are displayed in the following table. The first column ($\alpha$) shows the tilt angle $\alpha$ in degrees. The second column ($N_{BIT}$) shows the total number of bits of the sample. The third column ($N_{TD}$) shows the number of bits thereof which was erroneously detected by the threshold detector 34.1. The fourth column ($N_{RLPB}$), the fifth column ($N_{SHIFT}$) and the sixth column ($N_{STSD}$) respectively show the remaining number of errors after the runlength pushback detection 34.2, the shift detector 34.3 and the correction module 35. As a comparison the seventh column ($N_{VITERBI}$) shows the number of errors introduced by a 5-tap Viterbi detector with 8 states, and having a partial response (0.29, 0.5, 0.58, 0.5, 0.29).

| $\alpha(°)$ | $N_{BIT}$ | $N_{TD}$ | $N_{RLPB}$ | $N_{SHIFT}$ | $N_{STSD}$ | $N_{VITERBI}$ |
|---|---|---|---|---|---|---|
| −0.8 | 709389 | 17917 | 6279 | 3006 | 2780 | 3060 |
| −0.7 | 2010117 | 35409 | 8332 | 3576 | 2632 | 3071 |
| −0.6 | 2010117 | 20715 | 1812 | 645 | 274 | 550 |
| −0.5 | 1891869 | 9532 | 286 | 127 | 28 | 42 |
| −0.4 | 2128365 | 1883 | 32 | 30 | 30 | 30 |
| −0.3 | 2010117 | 325 | 4 | 4 | 4 | 3 |
| −0.2 | 2010117 | 52 | 7 | 7 | 9 | 8 |
| 0.0 | 2010117 | 1 | 1 | 1 | 1 | 1 |
| 0.2 | 2128365 | 16 | 0 | 0 | 0 | 1 |
| 0.3 | 2128365 | 178 | 2 | 2 | 0 | 0 |
| 0.4 | 2010117 | 1500 | 4 | 4 | 3 | 0 |
| 0.5 | 2010117 | 4985 | 117 | 81 | 24 | 25 |
| 0.6 | 1891869 | 13416 | 1142 | 549 | 275 | 309 |
| 0.7 | 1655373 | 22223 | 4763 | 2576 | 1929 | 1545 |
| 0.8 | 472893 | 7080 | 1321 | 622 | 420 | 407 |

As can be see in this table, the number of errors in the signal which is detected by the preliminary detection module 34 is even further reduced by the correction module 35. The correction module 35 reduces the number of errors in the detected signal close to or even below that of a Viterbi detector.

Figure 5:
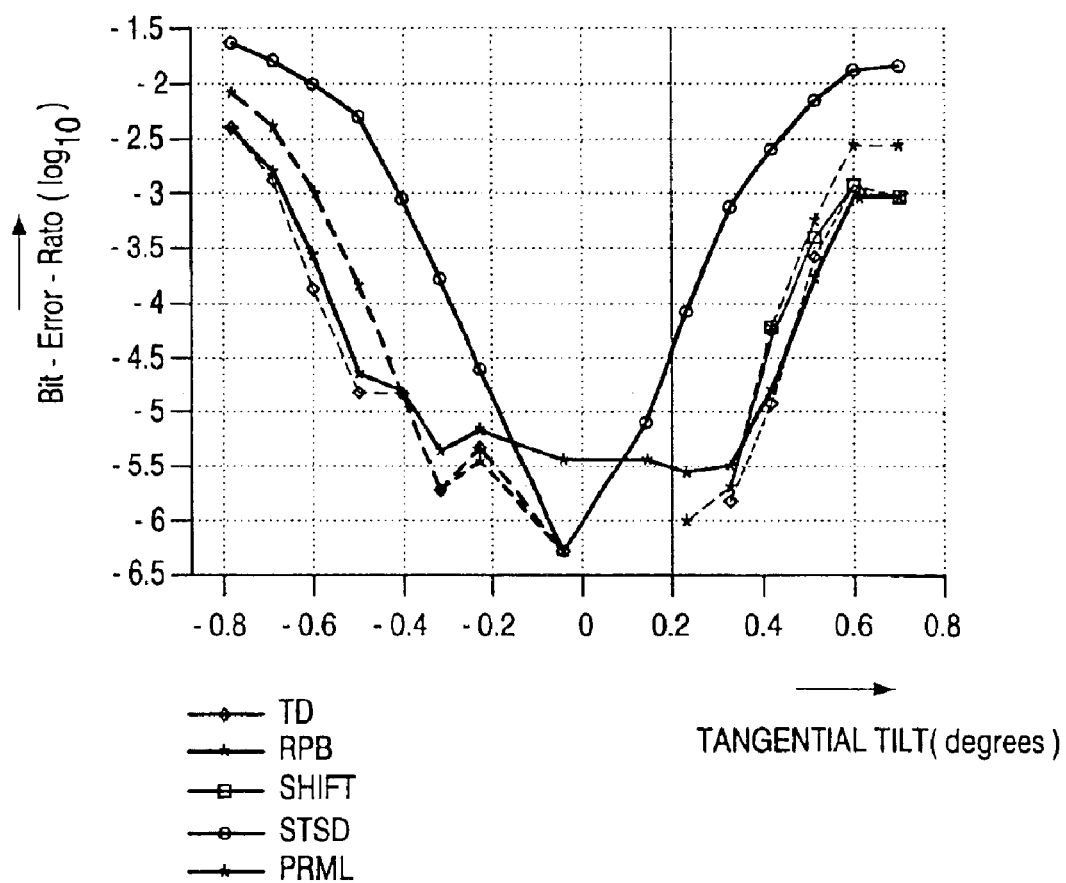
FIG. 5 shows a comparison of the bit-error rate for the detection unit according to the invention and detectors not according to the invention.

A comparison of the bit-error rate of several detectors further illustrated in FIG. 5. Measurement results are shown therein for a threshold detector (o), a combination of a threshold detector with a runlength pushback detector (*), a combination of a threshold detector, a runlength pushback detector and a shift detector ( ), a combination of a threshold detector, a runlength pushback detector, a shift detector and a correction module according to the invention (✧) and a PRML detector (*). As shown therein, the performance of the combination of a threshold detector, a runlength pushback detector, a shift detector and a correction module according to the invention is similar to that of the PRML-detector, even for a high-density disk which is played back at a high tilt-angle. However the detection unit according to the invention is computationally more simple because it obviates the use of recursive operations as is the case in a standard PRML-detector.

It is remarked that the scope of protection of the invention is not restricted to the embodiments described herein. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general purpose processor. The invention resides in each new feature or combination of features.

What is claimed is:

1. Detection unit for recovering a binary sequence from an analogue signal representing a runlength limited sequence including a preliminary detection module for generating a preliminary binary signal from the analogue signal and a correction module for generating a corrected binary signal from the preliminary binary signal, the correction module comprising a delay line having a chain of delay elements, coupled to the preliminary detection module, storage means for storing one or more first binary patterns and one or more second binary patterns for each of the first binary patterns, a comparator coupled to the delay line and the storage means, for outputting a detection signal indicating whether a sequence of bits present in the preliminary binary signal is identical to a first binary pattern, an evaluator coupled to the storage means and to the input for computing an evaluation value indicating the likelihood that a binary pattern corresponds to the runlength limited sequence represented by the analogue signal, a selector for selecting a binary pattern from the first binary pattern and the one or more second binary patterns for said first binary pattern having the highest likelihood, a corrector for correcting the sequence of bits in the delay line such that it corresponds to the selected binary pattern, if said selected binary pattern is not the first binary pattern, an output coupled to the delayline.

2. Detector according to claim 1, characterized in that the first binary pattern and the one or more second binary patterns differ at one bit, which bit is positioned at the edge of a run in the second binary pattern having a length greater than the minimum allowed runlength.

3. Detector according to claim 2, characterized in that the preliminary detection module comprises, a slicer coupled to the input, a runlength pushback detector coupled to the output of the slicer, a shift detector coupled to the output of the runlength pushback detector which detects timeshifted runs having a length corresponding to the minimum runlength.

4. Detector according to claim 1, characterized in that the likelihood for a particular binary sequence is calculated from the difference between a value of the analogue signal and a reference level.

5. Detector according to claim 4, characterized in that the reference level is computed from said binary sequence with a finite length channel model representing the optical impulse response.

6. Detector according to claim 4, characterized in that the reference level corresponding to a particular binary sequence is computed by measuring an amplitude value of the analog input signal during a plurality of occurrences of a particular binary sequence and averaging said amplitude values.

7. Device for reproducing an information carrier comprising a read head for reproducing a read signal from a physically detectable pattern in tracks at the information carrier, movement means for causing a relative movement between the information carrier and the read head, a detector according to claim 1 for reproducing a binary signal from the read signal, a first circuitry module for controlling the movement means, a second circuitry module for generating an output information signal from the binary signal by channel decoding and/or error correction decoding.

8. Method for recovering a binary sequence from an analogue signal representing a runlength limited sequence, the method comprising generating a preliminary binary signal from the analogue signal, comparing a sequence of bits present in the preliminary with a first binary pattern, if the comparison has a positive result for a first binary pattern computing an evaluation value for said first binary pattern and for one or more second binary patterns, the evaluation value indicating the likelihood that a binary pattern corresponds to the runlength limited sequence represented by the analogue signal, selecting a binary pattern from the first binary pattern and the one or more second binary patterns for said first binary pattern which has the highest likelihood, correcting the sequence of bits in the preliminary binary signal such that it corresponds to the selected binary pattern, if said selected binary pattern is not the first binary pattern.

9. The method according to claim 8 characterized in that the first binary pattern and the one or more second binary patterns differ at exactly one bit, which bit is positioned at the edge of a run in the second binary pattern having a length greater than the minimum allowed runlength.

* * * * *